United States Patent [19]
Fernandez et al.

[11] Patent Number: 5,448,200
[45] Date of Patent: Sep. 5, 1995

[54] DIFFERENTIAL COMPARATOR WITH DIFFERENTIAL THRESHOLD FOR LOCAL AREA NETWORKS OR THE LIKE

[75] Inventors: Francisco J. Fernandez, Upper Macungie; Robert H. Leonowich, Muhlenberg, both of Pa.

[73] Assignee: AT&T Corp., Murray Hill, N.J.

[21] Appl. No.: 810,272

[22] Filed: Dec. 18, 1991

[51] Int. Cl.⁶ .......................... G06G 7/12; H03K 3/289
[52] U.S. Cl. ...................................... 327/560; 327/562; 327/563; 327/202; 327/203
[58] Field of Search ............... 307/350, 362, 363, 494, 307/296.1, 296.6, 296.7, 272.2; 327/560, 562, 563, 202, 203, 359

[56] References Cited

U.S. PATENT DOCUMENTS

| | | | |
|---|---|---|---|
| 4,585,957 | 4/1986 | Ooms | 307/272.2 |
| 4,883,987 | 11/1989 | Fattaruso | 307/494 |
| 4,922,131 | 5/1990 | Anderson et al. | 307/494 |
| 4,970,406 | 11/1990 | Fitzpatrick et al. | 307/272.2 |
| 5,061,862 | 10/1991 | Tamagawa | 307/296.1 |
| 5,065,055 | 11/1991 | Reed | 307/296.1 |

OTHER PUBLICATIONS

"International Standard", *ISO 8802-3 ANSI/IEEE Std.802.3*, First Edition 1989-02-24, pp. 92-99.
"A CMOS Ethernet Serial Interface Chip", *Digest of Technical Papers*, ISSCC 84/Thursday, Feb. 23, 1984/Imperial Ballroom/ THAM 13.1 pp. 184 and 185.
"10 MB/S Twisted Pair CMOS Transceiver with Transmit Waveform Pre-Equalization" *IEEE 1991 Custom Integrated Circuits Conference*, Cheng-chung Shih, Joe Heideman, Haim Shafir, Stefan Wurster, pp. 7.3.1 to 7.3.4.

*Primary Examiner*—Timothy P. Callahan
*Assistant Examiner*—Trong Phan
*Attorney, Agent, or Firm*—Scott W. McLellan

[57] ABSTRACT

A master-slave differential comparator having a threshold value. The master section controls the threshold value of the slave section. The slave section is controlled by bias currents therein to matching same in the master section. The bias currents are substantially determined by fixed biases applied to the master section, the difference in biases being substantially equal to the threshold value of the comparator.

12 Claims, 4 Drawing Sheets

DIFFERENTIAL COMPARATOR WITH DIFFERENTIAL THRESHOLD FOR LOCAL AREA NETWORKS OR THE LIKE

BACKGROUND OF THE INVENTION

Cross-Reference to Related Application

This application is related to a co-pending patent application titled "Balanced Line Driver for Local Area Networks or the Like", by R. H. Leonowich, Ser. No. 07/810,632, filed simultaneously with, and assigned to the same assignee, as this application.

Field of the Invention

This invention relates to integrated circuit comparators in general and, more particularly, to differential comparators disposed in an integrated circuit.

Description of the Prior Art

Many hard-wired digital communication systems use a twisted pair of wires as the communication medium between nodes on the network. For example, the CSMA/CD local area network systems (Carrier Sense Multiple Access with Collision Detection, part of the IEEE 802.3 standard), may use the Attachment Unit Interface standard (shielded wire pairs) to communicate between users on the network and a coaxial cable backbone. 10BASE-T local area network systems may use unshielded wire pairs to communicate between users. Similarly, digital carrier systems for telephone applications (such as T1 carrier) use wire pairs as the transmission medium. While a wire pair is inexpensive, compared to coaxial cable, wire pair based systems are more susceptible to cross-talk (particularly unshielded wires) and other interference than coaxial cable based systems. This susceptibility of wire pair communication systems to corruption may make the digital receivers therein more complex than their coaxial cable based counterparts.

To increase the robustness of the wire pair digital receiver, a fully differential receiver should be used. The differential receiver converts the data on the wire pair from differential form to non-differential form, sometimes referred to as single-ended form. The advantage of using a differential receiver is the relative insensitivity of the receiver to common mode signals. Thus, induced noise (crosstalk, for example) which appears mostly as common mode noise is rejected while the desired signal, being differential (longitudinal), is detected. However, not all noise is common mode. Moreover, when a transmitter is silent (no desired data is being sent), the receiver may interpret received noise as "valid" data. To reject noise during periods of "silence", a threshold should be provided in the receiver to accept signals as data when the differential signals exceed the threshold.

Some prior art receivers are not "true" differential receivers employing a fully differential comparator arrangement. Instead, "conventional" comparators are used to approximate a "true" differential receiver. An exemplary ersatz digital receiver is shown in FIG. 6. Here, two "conventional" (nondifferential) comparators 61, 62 individually compare signals from inputs IN+, IN− to a threshold established by bias 63, here shown as a voltage source. This design approximates a differential comparator with threshold but suffers from being susceptible to common mode signals since the comparators 61, 62 are not differential. Such an arrangement may not satisfactory for high electrical noise environments.

Thus, it is desirable to have a true differential comparator with a predetermined threshold in digital communication system receivers, such as a receiver for a wire pair based local area network.

SUMMARY OF THE INVENTION

A differential comparator, with two inputs, is characterized by having a master section and a slave section. The master section (having an output and having inputs coupling to fixed biases) establishes a differential threshold value for the comparator. The slave section (responsive to the two comparator inputs and to the output of the master section), compares signals on the two comparator inputs and produces an output when the signals differentially exceed the threshold value.

The differential comparator, according to one embodiment of the invention, provides for a true differential comparator with a differential threshold voltage substantially determined by the bias currents therein. In a particular embodiment, the differential threshold value is substantially determined by the bias current in a differential pair of transistors in the slave section responsive to the differential input signals. In another particular embodiment, the differential threshold value is substantially determined by the bias currents in an amplifier stage in the slave section which are responsive to a differential pair of transistors. The differential pair is responsive to the differential input signal but with fixed bias current.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
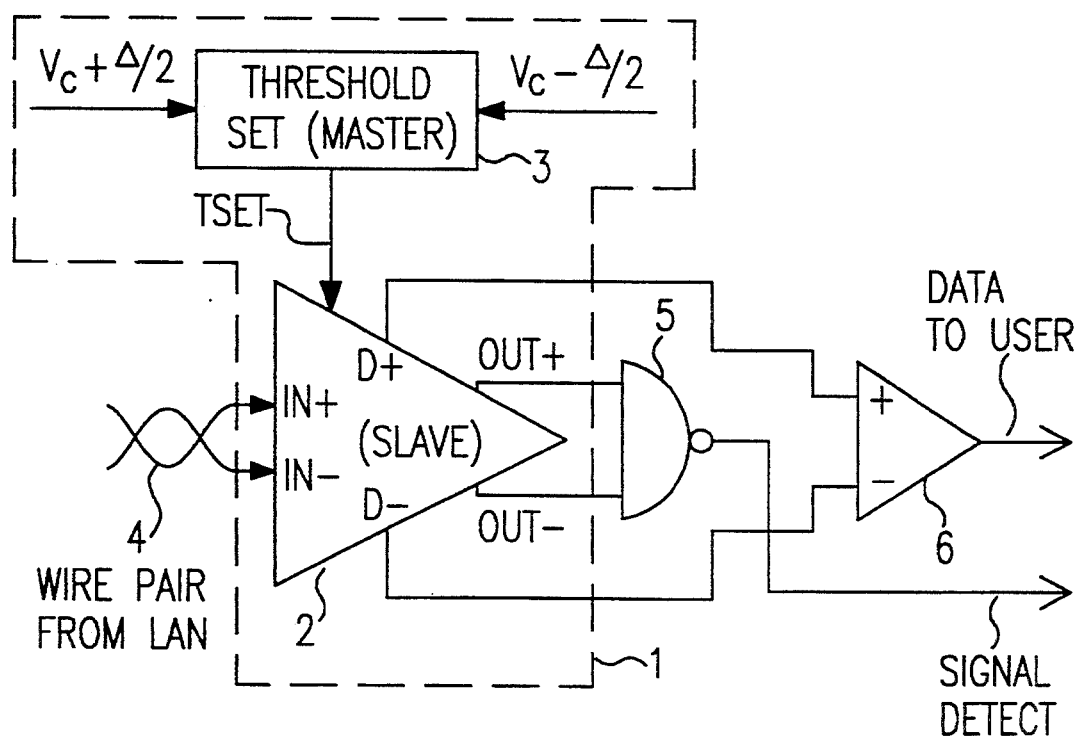
FIG. 1 is a simplified block diagram of an exemplary local area network receiver utilizing a differential comparator with a threshold for signal detection (squelch) operation.

The invention may be understood generally by referring to FIG. 1. Here, a differential comparator 1, with two inputs (IN+, IN−), is characterized by having a master section 3 and a slave section 2. The master section 3 (having an output TSET and having inputs (not numbered) coupling to fixed biases $V_c + \Delta/2$, $V_c - \Delta/2$), where A is the differential threshold value for the comparator. The slave section (responsive to the two comparator inputs IN+, IN− and to the output TSET of the master section) compares signals on the two comparator inputs and produces an output (OUT+, OUT−) when the signals differentially exceed the differential threshold value. In this embodiment, a signal on OUT+ is asserted when a signal on IN+ exceeds a signal IN− by Δ and a signal on OUT− is asserted when the signal IN− exceeds the signal IN+ by Δ.

More particularly, the differential comparator 1, according to one embodiment of the invention (FIGS. 3 or 5), provides for a true differential comparator with a differential threshold voltage substantially controlled by the bias currents in a slave section. In one particular embodiment (FIG. 3) of the invention, the differential threshold value is substantially controlled by the bias currents (e.g., $I_S$) in an amplifier stage $17_L$, $17_R$ in the slave section 2 responsive to a differential pair of transistors 13. The differential pair 13, with fixed bias current, is responsive to the differential input signal IN+, IN−. In another particular embodiment of the invention (FIG. 5), differential threshold value is substantially controlled by the bias current $I_b$ in the differential pair of transistors 31 in the slave section 2 responsive to the differential input signals. In both embodiments, the threshold value of the comparator is substantially determined by the fixed bias voltages ($V_c+\Delta/2$, $V_c-\Delta/2$) applied to a master section 3, the master section 3 controls the bias currents in the slave section 2. Preferably, the master section 3 and slave section 2 are found in a common integrated circuit.

Discussing the invention in more detail, in FIG. 1 and in accordance with one embodiment of the invention, an exemplary digital receiver (not numbered) is diagramed. As discussed briefly above, the receiver in FIG. 1 has a differential comparator 1 with a master section 3 and a slave section 2. Slave 2 provides two sets of outputs: D+, D− for data; and OUT+, OUT− for valid signal detection. The inputs IN+, IN− are shown here as coupled to a communication media, such as a twisted pair of wires 4 used in the Auxiliary Unit Interface (AUI), part of the IEEE 802.3 local area network (LAN) data communication standard. Master 3 sets the threshold value for differential signals on inputs IN+, IN− of stage 2 to exceed before the outputs OUT+, OUT− changes. Thus, master 3, in this example, sets the threshold for signal detection (squelch) since the outputs OUT+, OUT− will not change unless a differential signal is received with an amplitude exceeding the threshold Δ. The outputs D+, D− are not subject to the threshold requirements discussed above, as will be discussed in more detail below.

As will be discussed in more detail below, NAND gate 5 combines the signals from outputs OUT+, OUT− to provide a single-ended indication that a sufficiently strong differential signal has been received (SIGNAL DETECT). Conventional comparator 6 combines outputs D+, D− into a single-ended data signal for further processing by the user.

Figure 2:
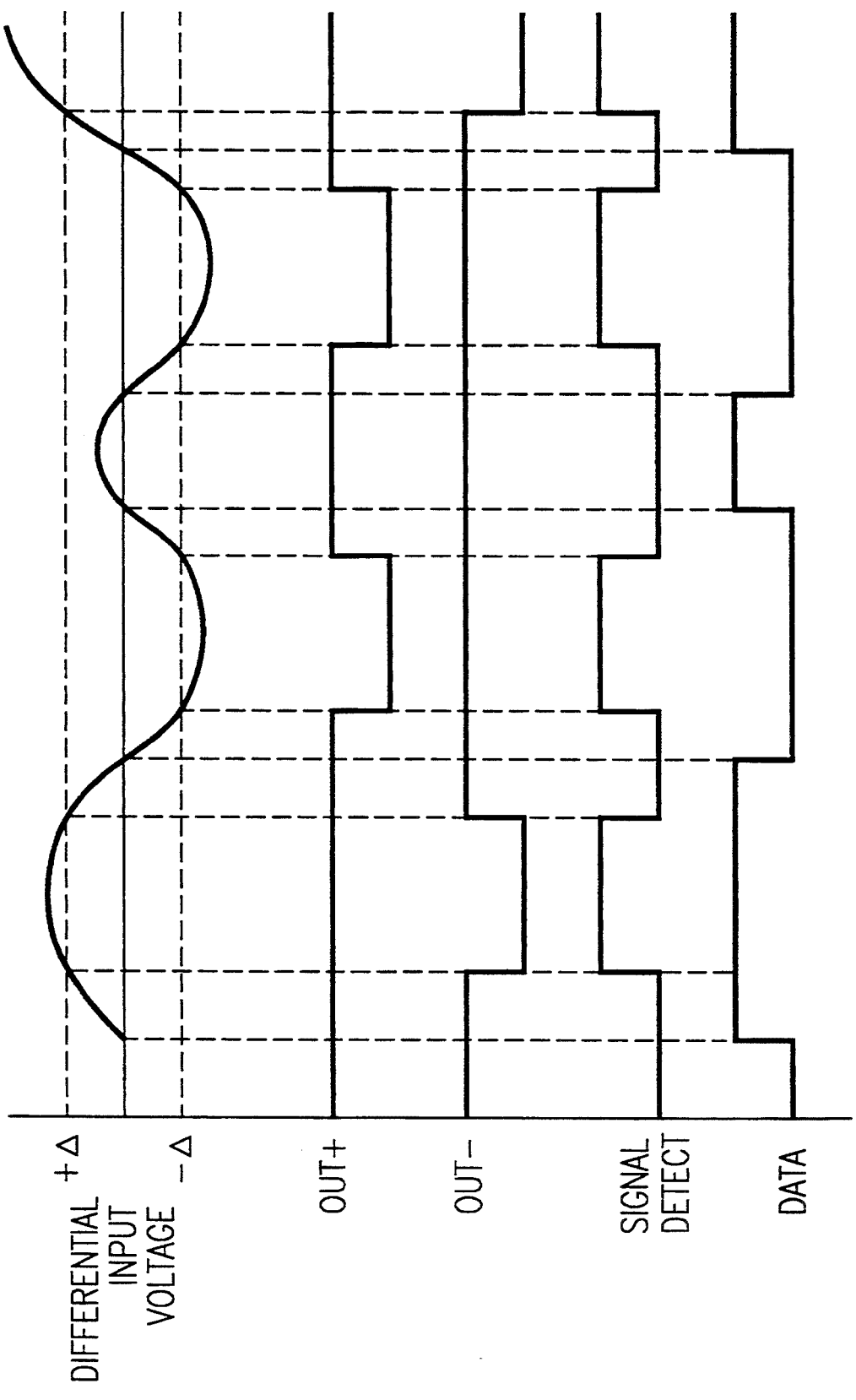
FIG. 2 is a diagram of signals of exemplary operation of the comparator of FIG. 1.

An illustrative example of the operation of the differential comparator 1 is shown in FIG. 2. As shown, a differential signal is applied to inputs IN+, IN− (only the differential value of the signal is shown). When the input signal exceeds the differential amount (Δ), an output (OUT+, OUT−) changes state. NAND gate 5 (FIG. 1) combines these signals to produce a squelch signal (SIGNAL DETECT) which goes "high" when the differential input signal exceeds the threshold Δ. In addition, the outputs D+, D− from slave section 2 (FIG. 1) drive conventional comparator 6 (FIG. 1) to produce the single-ended output DATA as shown.

Note that the state of DATA changes depending on the polarity of the input signal; no threshold requirements are imposed.

Figure 3:
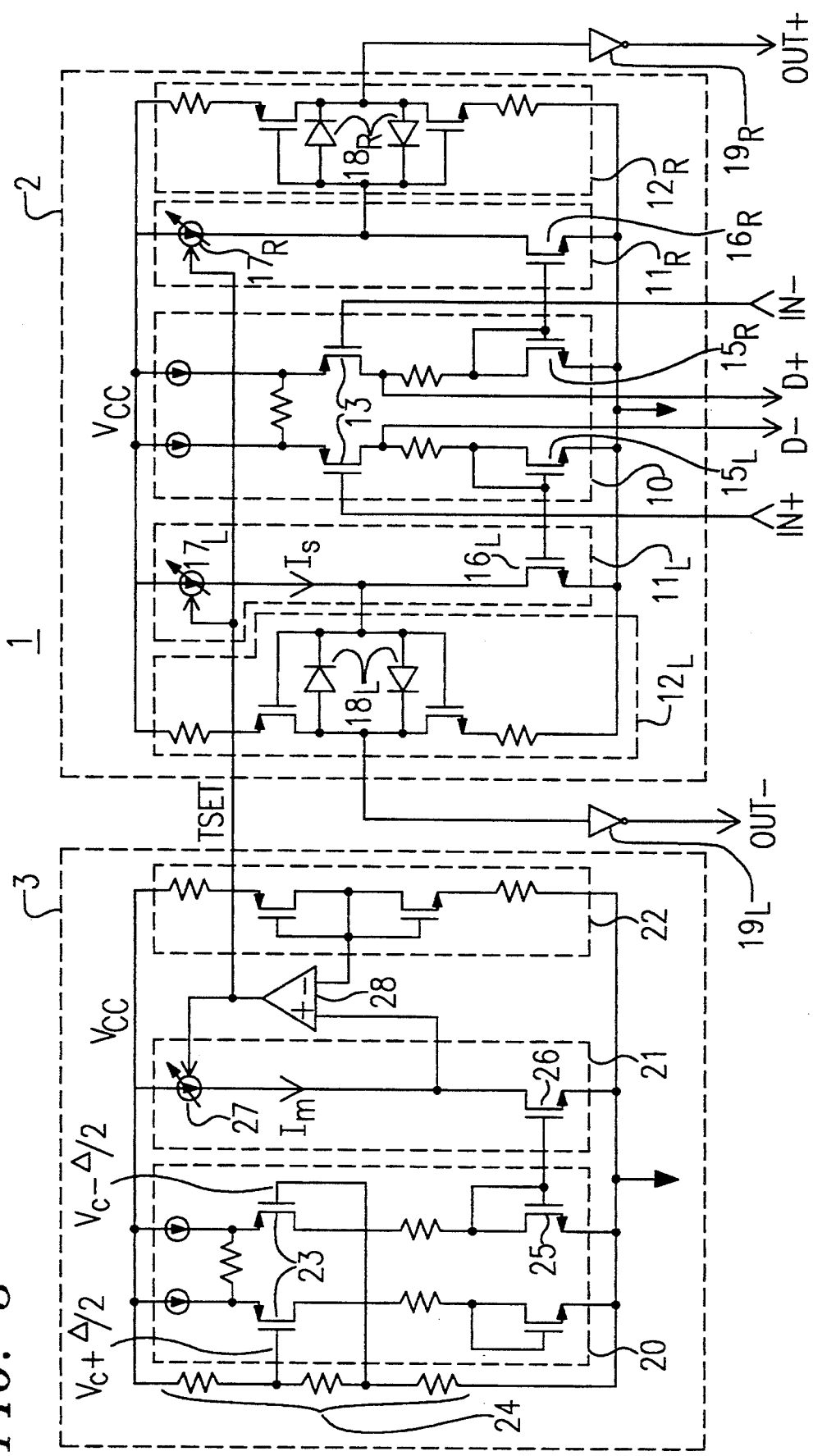
FIG. 3 is a simplified schematic of an exemplary differential comparator according to one embodiment of the invention.

One implementation of the sections 2, 3 of the invention is shown in FIG. 3. Each section 2, 3 has substantially identical differential amplifiers 10, 20, respectively. Similarly, sections 2, 3 each have substantially identical variable bias amplifier stages $11_L$, $11_R$, and 21 as well as substantially identical gain stages $12_L$, $12_R$, and 22. It is noted that the gain stage 22 differs from stages $12_L$, $12_R$ by the feedback used; stage 22 has the input connected to output to form a reference while $12_L$ and $12_R$ have nonlinear feedback (diode clamps), as will be discussed in more detail below. It is also noted that the stages 20, 21 and 22 in master section 3 may be substantially identically scaled with corresponding stages in slave section 2.

The differential amplifier 20 has a pair of differential transistors 23 responsive to a two-tap resistive voltage divider 24. The voltage of one tap of the divider is approximately $V_c+\Delta/2$ while the voltage on the other tap is approximately $V_c-\Delta/2$. The difference in voltage being Δ, the desired amount of threshold for the differential comparator 1. $V_c$ is the desired operating common mode voltage for the comparator 1. For purposes here, $V_c$ is approximately $V_{cc}/2$, where $V_{cc}$ is the voltage supply to the comparator 1, the other supply voltage being substantially zero volts, or ground. Differential output current from the differential amplifier 20 is mirrored by transistor 25 to flow in the drain of transistor 26 of variable bias amplifier 21. Gain stage 22 is a conventional CMOS inverter with the input and output shorted together and resistive current limiting. Stage 22 acts as a reference to provide a reference output voltage to operational amplifier 28. The reference voltage is approximately the threshold voltage of the amplifier stage 22 (and that of stages $12_L$, $12_R$, approximately $V_{cc}/2$. Operational amplifier (opamp) 28 serves to keep the voltage on the drain of transistor 26 substantially equal to the reference voltage from amplifier stage 22. This is accomplished by varying the amount of current bias to transistor 26 by a voltage-controlled current source 27. The control voltage from opamp 28 (TSET) is the control signal to slave section 2 to set the threshold voltage of the comparator 1.

Figure 4:
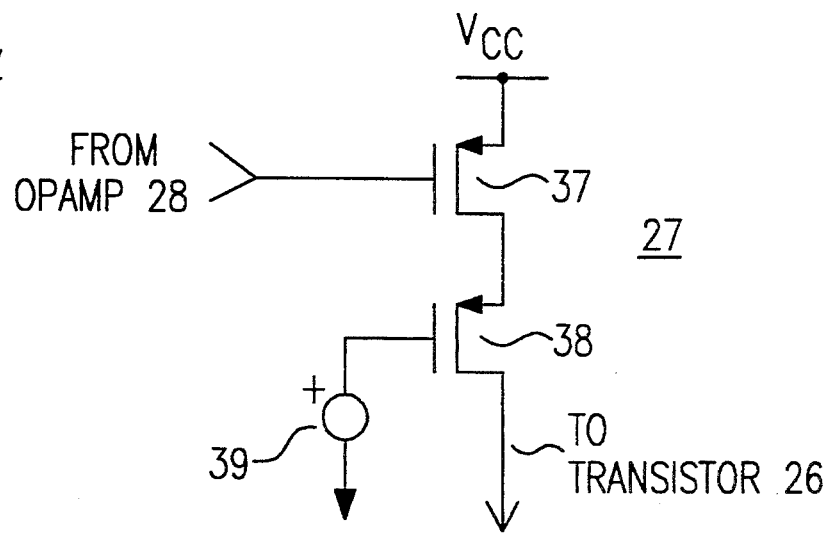
FIG. 4 is a simplified schematic diagram of a voltage controlled current source used in the comparator shown in FIG. 3.
Figure 6:
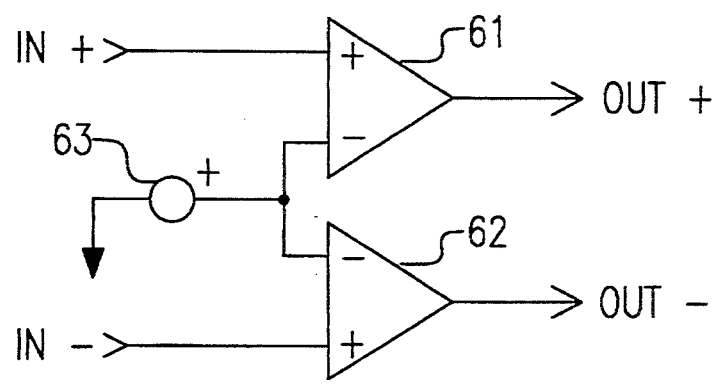

Referring temporarily to FIG. 4, an exemplary voltage-controlled current source 27 is diagramed. Here, the control voltage from opamp 28 (TSET) varies the amount of current flowing in transistor 37 and, thus, through transistor 38 to the transistor 26. Having the gate of transistor 38 coupled to a fixed voltage increases the output resistance of the voltage controlled current source 27.

Returning to FIG. 3, the stages in the slave section 2 are substantially identical to corresponding stages in the master section 3 as discussed above. In addition, the embodiment of the slave section 2 is shown having symmetrical (and substantially identical) left and right stages (subscripts denoting which side the stage appears). Thus, for clarity, the detailed description here will refer to just the left-hand side of the slave section 2. Also discussed above, the differential amplifier 10 in section 2 is substantially identical to the corresponding amplifier 20 in section 3. Thus, stage 10 has a differential pair of transistors 13 substantially identical to the differential pair of transistors 23 in stage 20. In addition, the stages $11_L$ and $12_L$ are substantially identical to corresponding stages 21, 22 in the master section 3.

In more detail, the differential amplifier 10 has a current-mirroring transistor $15_L$ substantially identical to corresponding transistor 25 in amplifier 20. Similarly, transistor $16_L$ and voltage-controlled current source $17_L$ in variable bias amplifier stage $11_L$ are substantially identical to corresponding transistor 26 and source 27 in amplifier stage 21. The voltage-controlled current source $17_L$ is also controlled by a signal from opamp 28, the signal labeled here as TSET (threshold set). The substantially identical nature of the stages $11_L$, 21 and the common control signal TSET makes the currents $I_M$, $I_S$ from corresponding sources $17_L$, 27 substantially equal. The substantially equal current, $I_M$, $I_S$ makes the electrical characteristics (e.g. threshold voltage) of the two stages $11_L$, 21 substantially equal.

Also as stated above, the gain stage $12_L$ is substantially identical to stage 22 (used as a reference for opamp 28). Instead of a direct connection between input and output of stage $12_L$ as in stage 22, voltage limiters $18_L$ are used to provide high gain near the transition region of the gain stage's input-to-output transfer characteristic. (Voltage limiters $18_L$ are shown here as diode which, as is well known in the art, may be diode-connected enhancement MOSFETs.) The voltage swing of the outputs OUT+, OUT− is thus limited by the clamping voltage of the voltage limiters $18_L$, $18_R$, and is sufficient to switch the NAND gate 5 (FIG. 1) after further amplification by inverting amplifiers $19_L$ $19_R$.

Since the stages in the master section 3 are substantially identical to the corresponding stages in the slave section 2, and the voltage-controlled current source $17_L$ is controlled along with corresponding source 27, the master section 3 adjusts the variable bias amplifier stage $11_L$ to set the threshold voltage of slave section 2. More particularly, the master section 3, as substantially determined by the difference in voltages applied to the inputs thereto (established by resistor string 24), varies the bias in stages $11_L$ and stage 21. Since the slave section 2 has a differential input and output (section 2 is symmetrical), the slave section 2 will respond to a differential signal on inputs IN+, IN− that exceeds the threshold voltage Δ.

Additional outputs D+, D− are coupled to the drain outputs of transistors 13 to provide additional gain to the differential input signals applied to inputs IN+, IN− prior to slicing by conventional comparator 6 (FIG. 1).

Figure 5:
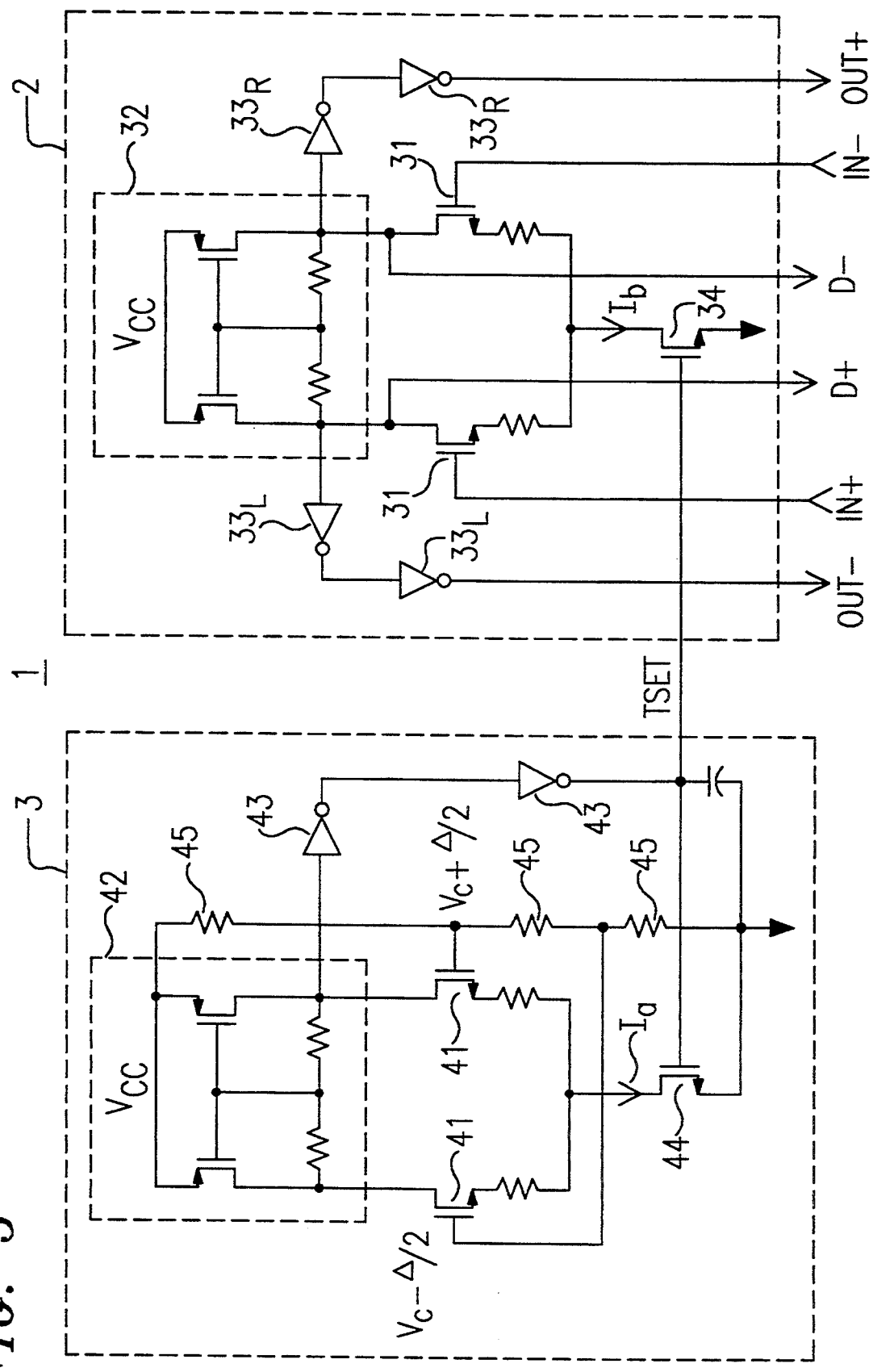
FIG. 5 is a simplified schematic of an exemplary differential comparator according to another embodiment of the invention; and, FIG. 6 is a simplified diagram of prior art comparators used in local area networks to approximate differential comparison with a threshold value.

Another embodiment of the invention is shown in FIG. 5. Here, as with the previous embodiment, a differential comparator 1 has two sections, a master section 3 and a slave section 2. Also in the embodiment of FIG. 5, the master section 3 controls the slave section 2 to set the threshold value for the slave 2. Unlike the the embodiment of FIG. 3, the threshold voltage of the slave 2 is substantially determined by the current $I_b$ flowing through differential pair of transistors 31.

The master section 3 has a differential pair of transistors 41, substantially identical to the differential pair of transistors 31 in the slave section 2. The outputs of the differential pair 41 couple to a reciprocal or bilateral current mirror 42 and to two series-coupled amplifiers 43, here conventional CMOS inverters. The output of the amplifiers 43 controls transistor 44 to provide a bias current $I_a$ in the transistors 41. The amount of bias current is heavily dependent on the voltages applied to the gates (inputs) of the differential pair 41, here established by a resistor string 45, similar to the resistors 24 in FIG. 3. The difference in voltages applied to the gates of transistors 41 is substantially equal to the desired threshold voltage, Δ, of the differential comparator 1.

In addition to the differential pairs 31, 41, the slave section 2 has a reciprocal (bilateral) current mirror 32, amplifiers $33_L$, $33_R$, and transistor 34 corresponding to, and substantially identical to, mirror 42, amplifiers 43, and transistor 34 in master section 3. By virtue of the matching of transistors 34 and 44, and transistor 34 being controlled by the amplifiers 43, the current $I_b$ substantially the same as current $I_a$. Thus, the master section 3 establishes the threshold value for the slave 2.

Having described the preferred embodiment of this invention, it will now be apparent to one of skill in the art that other embodiments incorporating its concept may be used. Therefore, this invention should not be limited to the disclosed embodiment, but rather should be limited only by the spirit and scope of the appended claims.

We claim:

1. A comparator having two inputs and a differential threshold value, disposed in an integrated circuit, having a first (slave) section, the first section being CHARACTERIZED BY:

a first differential pair of transistors (31) having a common output, two inputs, and two outputs, the inputs coupling to the inputs of the comparator;

a first variable current source (34) coupling to the common output of the first differential pair;

a first bilateral current mirror (32) coupling to the outputs of the first differential pair;

a first amplifier stage having an output and coupling to one output of the first differential pair, the output being an output of the comparator;

wherein the differential threshold value of the comparator is substantially determined by the current passed by the current source.

2. The comparator as recited in claim 1, having a second (master) section, the second section being characterized by:

a second differential pair of transistors (41) having a common output, two inputs, and two outputs, the inputs coupling to corresponding fixed biases, the difference in the biases being substantially equal to the threshold value of the comparator;

a second variable current source (44) coupling to the common output of the second differential pair;

a second bilateral current mirror (42) coupling to the outputs of the second differential pair;

a second amplifier stage (43) having an output and art input coupling to one output of the differential pair.

wherein the first and Second variable current sources are responsive to the output of the second amplifier stage to control the current passed by the sources.

3. The comparator as recited in claim 2, wherein the first and second differential pairs of transistors are substantially the same and the current carried by the first and second variable current sources are substantially the same.

4. A comparator having two inputs, an output, and a differential threshold value, the comparator having an first (slave) section, the first section being CHARACTERIZED BY:

a first differential pair of transistors (13), having two inputs and two outputs, the inputs coupling to the corresponding inputs of the comparator;

a first amplifier stage ($11_L$), having a variable bias ($17_L$), an input coupling to an output of the first differential pair, and an Output coupling to the output of the comparator;

wherein the differential threshold value of the comparator is substantially determined by the amount of bias in the amplifier stage.

5. The comparator as recited in claim 4, wherein the comparator has an second (master) section, the second section being characterized by:
- a second differential pair of transistors (23), having two inputs and two outputs, the inputs coupling to fixed biases;
- a second amplifier stage (21), having a variable bias (27), an input coupling to an output of the second differential pair, and an output;
- feedback means (28), coupling to the output of the second amplifier stage, for maintaining the output of the second amplifier stage substantially equal to a reference voltage by varying the bias in the second amplifier stage;
- wherein the feedback means additionally varies the bias in the first amplifier stage.

6. The comparator as recited in claim 5, wherein the first section is further characterized by an gain stage (12) having an output, a threshold value substantially equal to the reference voltage, and an input coupled to the output of the first amplifier stage, the output of the gain stage being the output of the comparator.

7. The differential comparator as recited in claim 6, wherein the feedback means is an operational amplifier.

8. The differential comparator as recited in claim 7, wherein the reference voltage is supplied by an additional gain stage (22), substantially similar to the gain stage in the first section, having an input and an output connected together to provide at the output thereof the reference voltage.

9. In an integrated circuit, a comparator having two inputs for comparing a signal on the inputs to a differential threshold value, and an output, CHARACTERIZED BY:
- a master section (3) having:
  - a first differential pair of transistors (23) with two inputs, two outputs, and a common output, the inputs connected to fixed biases having voltages differing by a predetermined voltage corresponding to the differential threshold voltage; and
  - means (21,28) coupled to the two outputs of the first pair of transistors, for producing a control signal (TSET) proportional to the predetermined voltage;
- and a slave section (2) having:
  - a second differential pair of transistors (13) with two inputs, two outputs, and a common output, the inputs coupling to the inputs of the comparator; and
  - amplifying means ($11_L$, $12_L$) including a variable current source ($17_L$) for providing bias currents in the amplifier means in response to the control signal, coupling to at least one of the outputs of the second pair of transistors and having an output coupling to the output of the comparator, for setting the differential threshold value of the comparator in response to the control signal.

10. The differential comparator as recited in claim 9, wherein the first and second pairs of differential transistors are substantially identical and the differential threshold value of the comparator is substantially equal to the predetermined voltage.

11. The differential comparator as recited in claim 9, wherein the means in the master section is further characterized by:
- a reference stage (22) having an output;
- an amplifier stage (21) having a bias varying in response to the control signal, an output, and an input coupled to at least one of the outputs of the first differential pair of transistors:
- feedback means (28), responsive to the output of the reference stage and the amplifier stage, for generating the control signal such that the output of the amplifier stage is kept substantially equal to the output of the reference stage;
- and wherein the amplifier means in the slave section is further characterized by:
- at least one amplifier stage ($11_L$) with a bias varying in response to the control signal and an input coupled to the corresponding output of the second differential pair of transistors;
- at least one gain stage, responsive to the corresponding amplifier stage ($12_L$), having an output coupling to the output of the comparator.

12. The differential comparator as recited in claim 11, wherein the reference stage provides a reference voltage and each gain stage has a predetermined threshold voltage, the threshold voltage of the gain stage being substantially equal to the reference voltage.

* * * * *